United States Patent
Kim

(10) Patent No.: US 9,144,119 B2
(45) Date of Patent: Sep. 22, 2015

(54) ORGANIC LIGHT EMITTING DISPLAY APPARATUS AND METHOD OF MANUFACTURING THE SAME

(71) Applicant: Hoon Kim, Yongin (KR)

(72) Inventor: Hoon Kim, Yongin (KR)

(73) Assignee: SAMSUNG DISPLAY CO., LTD., Yongin, Gyunggi-Do (KR)

( * ) Notice: Subject to any disclaimer, the term of this patent is extended or adjusted under 35 U.S.C. 154(b) by 310 days.

(21) Appl. No.: 13/738,053

(22) Filed: Jan. 10, 2013

(65) Prior Publication Data

US 2014/0062290 A1    Mar. 6, 2014

(30) Foreign Application Priority Data

Sep. 4, 2012   (KR) .......................... 10-2012-0097866

(51) Int. Cl.
| | |
|---|---|
| H01J 1/62 | (2006.01) |
| H01J 63/04 | (2006.01) |
| H05B 33/04 | (2006.01) |
| H05B 33/10 | (2006.01) |
| H01L 51/52 | (2006.01) |
| H01L 27/32 | (2006.01) |

(52) U.S. Cl.
CPC .............. *H05B 33/04* (2013.01); *H01L 51/525* (2013.01); *H05B 33/10* (2013.01); *H01L 27/3246* (2013.01)

(58) Field of Classification Search
CPC ................................ H05B 33/04; H05B 33/10
USPC ................................ 313/498–512; 445/23–25
See application file for complete search history.

(56) References Cited

U.S. PATENT DOCUMENTS

| | | | |
|---|---|---|---|
| 8,106,583 B2* | 1/2012 | Shin et al. ...................... 313/506 |
| 2005/0012454 A1* | 1/2005 | Yamazaki et al. ............ 313/506 |
| 2009/0058294 A1* | 3/2009 | Joo et al. ........................ 313/512 |
| 2009/0115325 A1* | 5/2009 | Matsuzaki et al. ............ 313/504 |
| 2010/0171138 A1* | 7/2010 | Yamazaki et al. ............... 257/98 |
| 2011/0018008 A1* | 1/2011 | Lee ................................. 257/88 |
| 2011/0163340 A1 | 7/2011 | Smith |
| 2011/0204772 A1* | 8/2011 | Egawa .......................... 313/504 |
| 2013/0048967 A1* | 2/2013 | Nishido et al. .................. 257/40 |

FOREIGN PATENT DOCUMENTS

| | | |
|---|---|---|
| KR | 10-2010-0009058 A | 1/2010 |
| KR | 10-2010-0035312 A | 4/2010 |
| KR | 10-2011-0035230 A | 4/2011 |
| KR | 10-2012-0046704 A | 5/2012 |
| WO | WO 2012-060621 A2 | 5/2012 |

* cited by examiner

*Primary Examiner* — Thomas A Hollweg
*Assistant Examiner* — Kevin Quarterman
(74) *Attorney, Agent, or Firm* — Lee & Morse, P.C.

(57) ABSTRACT

An organic light emitting display apparatus includes a substrate, a display portion on the substrate, the display portion including a plurality of emission regions, each including an organic light emitting diode (OLED), and a plurality of non-emission regions protruding from between the plurality of emission regions, an encapsulation substrate facing the substrate, a sealing material bonding the substrate and the encapsulation substrate and sealing the display portion, and a filling material on a surface of the encapsulation substrate facing the display portion, the filling material being spaced apart from the OLED and being formed of a cured polyimide (PI).

16 Claims, 7 Drawing Sheets

ORGANIC LIGHT EMITTING DISPLAY APPARATUS AND METHOD OF MANUFACTURING THE SAME

CROSS-REFERENCE TO RELATED APPLICATION

This application claims the benefit under 35 U.S.C. §119 of Korean Patent Application No. 10-2012-0097866, filed on Sep. 4, 2012, in the Korean Intellectual Property Office, the disclosure of which is incorporated herein in its entirety by reference.

BACKGROUND

1. Field

Embodiments relate to an organic light emitting display apparatus and a method of manufacturing the organic light emitting display apparatus, and more particularly, to an organic light emitting display apparatus including a filling material and a method of manufacturing the organic light emitting display apparatus.

2. Description of the Related Art

Recently, display apparatuses have been replaced with portable thin flat panel display apparatuses. Among the flat panel display apparatuses, organic or inorganic light emitting display apparatuses are self-emissive display apparatuses having wide viewing angles, excellent contrast ratios, and high response speeds, and thus, are regarded as next-generation display apparatuses. Also, an organic light emitting display apparatus, including an emission layer formed of an organic material, has excellent luminosity, driving voltage, and response speed characteristics compared to inorganic light emitting display apparatuses, and may provide a color image.

SUMMARY

Embodiments are directed to an organic light emitting display apparatus including a substrate, a display portion on the substrate, the display portion including a plurality of emission regions, each including an organic light emitting diode (OLED), and a plurality of non-emission regions protruding from between the plurality of emission regions, an encapsulation substrate facing the substrate, a sealing material bonding the substrate and the encapsulation substrate and sealing the display portion, and a filling material on a surface of the encapsulation substrate facing the display portion, the filling material being spaced apart from the OLED and being formed of a cured polyimide (PI).

The filling material may contact the non-emission regions.

The organic light emitting display apparatus may further include a conductive layer on a surface of the filling material facing the display portion.

The filling material may be patterned such that parts of the filling material corresponding to the non-emission regions protrude in a direction of the display portion compared to parts of the filling material corresponding to emission regions.

Depths of the parts of the filling material corresponding to the emission regions in a direction away from the display portion may not be equal for each of the emission regions.

The filling material may be patterned such that only parts of the filling material corresponding to the non-emission regions are present.

The filling material may be patterned on the encapsulation substrate in a mesh type pattern.

A conductive layer may be present on the parts of the filling material corresponding to the non-emission regions.

The OLED may include a first electrode on the substrate, an organic light emitting layer on the first electrode, and a second electrode on the organic light emitting layer. The second electrode may be present over an entire surface of the non-emission regions and the second electrode contacts the conductive layer in the non-emission regions.

The organic light emitting display apparatus may further include a moisture absorbent disposed at one side of the sealing material facing the display portion.

Embodiments are also directed to a method of manufacturing an organic light emitting display apparatus, the method including coating a polyimide (PI) in a liquid state on one surface of an encapsulation substrate, forming a filling material in a solid state by curing the polyimide (PI) in the liquid state, providing a display portion on one surface of a display substrate, placing the display substrate and the encapsulation substrate such that the display portion and the filling material face each other, and bonding the display substrate and the encapsulation substrate using a sealing material.

The bonding may include coating the sealing material to surround edges of the filling material, placing the display substrate and the encapsulation substrate such that the display portion and the filling material face each other, and bonding the display substrate and the encapsulation substrate by using the sealing material in a vacuum state.

The forming of the filling material may include soft-baking the polyimide (PI) in the liquid state, patterning the soft-based polyimide (PI) using a mask, and forming the filling material in the solid state by curing the patterned polyimide (PI).

The method may further include, after the forming of the filling material, forming a conductive layer on the filling material.

The polyimide (PI) in the liquid state may include an organic solvent.

The method may further include, before the bonding, forming a moisture absorbent at one side of the sealing material facing the display portion.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
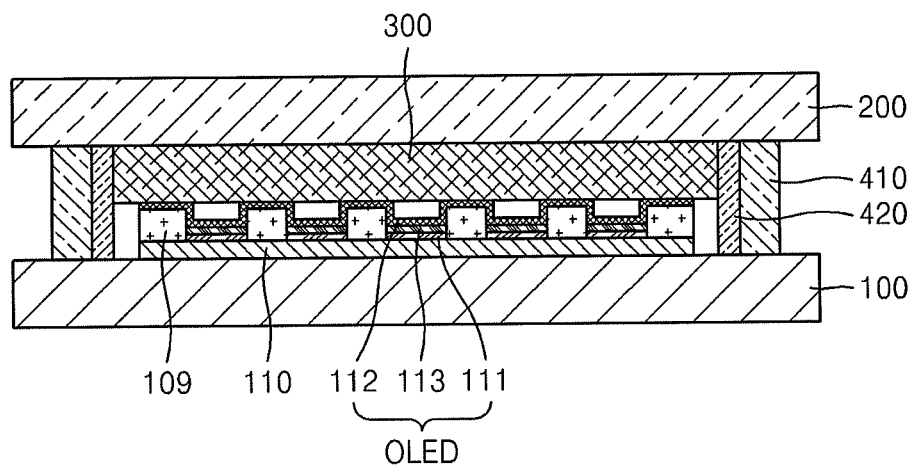
FIG. 1 is a schematic cross-sectional view of an organic light emitting display apparatus according to an embodiment.

Embodiments will be illustrated in the drawings and described in detail in the written description. However, this is not intended to be limiting to particular modes of practice, and it is to be appreciated that all changes, equivalents, and substitutes that do not depart from the spirit and technical scope are encompassed herein. In the description, certain detailed explanations of related art are omitted when it is deemed that they may unnecessarily obscure the essence thereof.

The terms such as "first" and "second" are used herein merely to describe a variety of constituent elements, but the constituent elements are not limited by the terms. The terms are used only for the purpose of distinguishing one constituent element from another constituent element.

It will be understood that when an element, layer or region is referred to as being "on" another element, layer or region, the element, layer or region can be directly on another element, layer or region or intervening elements, layers or regions.

Embodiments will now be described more fully with reference to the accompanying drawings, in which exemplary embodiments are shown. In the drawings, the same elements are denoted by the same reference numerals, and a repeated explanation thereof will not be given. The thicknesses of layers and regions are enlarged for clarity. In addition, the thicknesses of some layers and regions are exaggerated for convenience of explanation. Expressions such as "at least one of," when preceding a list of elements, modify the entire list of elements and do not modify the individual elements of the list.

Figure 2:
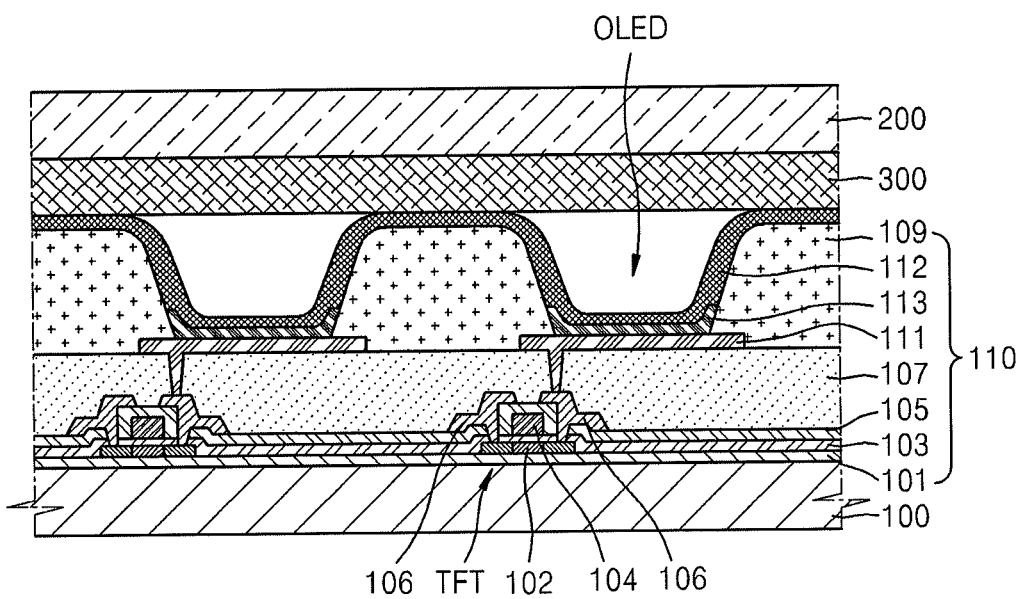
FIG. 2 is a schematic plan view of a part of the organic light emitting display apparatus of FIG. 1.

FIG. 1 is a schematic cross-sectional view of an organic light emitting display apparatus according to an embodiment. FIG. 2 is a schematic plan view of a part of the organic light emitting display apparatus of FIG. 1. FIGS. 3 through 6 are schematic cross-sectional views for sequentially describing a method of manufacturing the organic light emitting display apparatus of FIG. 1.

Referring to FIGS. 1 and 2, the organic light emitting display apparatus includes a substrate 100, a display portion 110 formed on the substrate 100, an encapsulation substrate 200 disposed to face the substrate 100, a sealing material 410 for bonding the substrate 100 and the encapsulation substrate 200 and sealing the display portion 110, and a moisture absorbent 420 disposed in one side of the sealing material 410. The organic light emitting display apparatus includes a filling material 300 formed in one surface of the encapsulation substrate 200 and formed of cured polyimide (PI).

The substrate 100 may be formed of a transparent glass material using $SiO_2$ as a main component. In other implementations, the substrate 100 may be formed of a transparent plastic material. The plastic material used to form the substrate 100 may be an insulating organic material selected from the group of polyethersulfone (PES), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), and cellulose acetate propionate (CAP).

In a case where the organic light emitting display apparatus is a bottom emission type display apparatus in which an image is formed in a direction of the substrate 100, the substrate 100 may be formed of a transparent material. However, in a case where the organic light emitting display apparatus is a top emission type display apparatus in which an image is formed in the opposite direction to the direction of the substrate 100, the substrate 100 may be formed of a non-transparent material. In this case, the substrate 100 may be formed of a metallic material. In a case where the substrate 100 is formed of the metallic material, the substrate 100 may include one or more materials selected from the group consisting of carbon, iron, chromium, magnesium, nickel, titanium, molybdenum, and stainless steel (SUS), as examples. The substrate 100 may be formed of a metallic foil.

A buffer layer 101 may be formed on an upper surface of the substrate 100 to planarize the upper surface and to prevent impurities from penetrating into the organic light emitting display apparatus. The buffer layer 101 may be formed of $SiO_2$ and/or $SiN_x$ via various deposition methods, such as plasma-enhanced chemical vapor deposition (PECVD), atmospheric pressure chemical vapor deposition (APCVD), low pressure chemical vapor deposition (LPCVD), etc. The buffer layer 101 may be omitted.

A thin film transistor (TFT) array is formed on an upper surface of the substrate 100. FIG. 2 illustrates only a single TFT for each pixel for convenience of explanation. However, it is to be understood that a plurality of TFTs and a storage capacitor may be further included in the organic light emitting display apparatus.

TFTs are electrically connected to an organic light emitting diode (OLED) to drive the OLED. The TFT shown in FIG. 2 is a top gate type TFT including an active layer 102, a gate electrode 104, and source/drain electrodes 106, which are sequentially formed. Although the TFT according to the present embodiment is a top gate type TFT, it is to be understood that various suitable types of TFTs may be used.

The active layer 102 may be formed on the buffer layer 101 by forming and patterning silicon, an inorganic semiconductor such as an oxide semiconductor, or an organic semiconductor on the entire surface of the substrate 100. In a case where the active layer 102 uses silicon, the active layer 102 including a source region, a drain region, and a channel region disposed therebetween may be formed by forming an amorphous silicon layer on the entire surface of the substrate 100, crystallizing the amorphous silicon layer, forming a polycrystalline silicon layer, patterning the polycrystalline silicon layer, and doping impurities in the source and drain regions of a boundary of the polycrystalline silicon layer.

A gate insulating layer 103 formed of $SiO_2$, $SiN_x$, or the like is formed on the active layer 102, and a gate electrode 104 is formed on a predetermined region of an upper portion of the gate insulating layer 103. The gate electrode 104 is connected to a gate line (not shown) for applying an on/off signal of a TFT.

An interlayer insulating layer 105 is formed on the gate electrode 104. A source electrode and a drain electrode 106 are formed to respectively contact the source region and the drain region of the active layer 102 through a contact hole. A TFT formed via this process is covered and protected by a passivation layer 107.

The passivation layer 107 may be formed as an inorganic insulating layer and/or an organic insulating layer. The inorganic insulating layer may include $SiO_2$, $SiN_x$, SiON, $Al_2O_3$, TiO$_2$, Ta$_2$O$_5$, HfO$_2$, ZrO$_2$, barium strontium titanate (BST), or lead zirconate titanate (PZT). The organic insulating layer may include polymer derivatives having commercial polymers (polymethylmethacrylate (PMMA) and polystyrene (PS)) and a phenol group, an acryl-based polymer, an imide-based polymer, an allyl ether-based polymer, an amide-based polymer, a fluorine-based polymer, a p-xylene-based polymer, a vinyl alcohol-based polymer, or a combination thereof. The passivation layer 107 may be formed as a multi-stack including the inorganic insulating layer and the organic insulating layer.

The OLED is formed in an emission region of the upper portion of the passivation layer 107. The emission region and a non-emission region are described herein along with a pixel-defining layer (PDL) 109.

The OLED includes a pixel electrode 111 formed on the passivation layer 107, an opposite electrode 112 facing the pixel electrode 111, and an intermediate layer 113 interposed therebetween. A display device is classified into a bottom emission type display device, a top emission type display device, a dual emission type display device, and the like according to emission directions. The bottom emission type display device includes a light transmitting electrode as the pixel electrode 111 and a reflective electrode as the opposite electrode 112. The top emission type display includes a reflective electrode as the pixel electrode 111 and a semi-transmitting electrode as the opposite electrode 112. Herein, a case where the display device is a bottom emission type display device is described. However, in other implementations, embodiments may be other emission type display devices.

The pixel electrode 111 is formed as a transparent layer formed of ITO, IZO, ZnO, or In$_2$O$_3$ having a high work function. The pixel electrode 111 may be patterned to have an island form that corresponds to each pixel. Also, the pixel electrode 111 may be connected to an external terminal (not shown) and thus may function as an anode electrode.

Meanwhile, the PDL 109 that is an insulating layer is formed having a predetermined thickness on the pixel electrode 111 so as to cover the pixel electrode 111. The PDL 109 may be formed of one or more organic insulating materials selected from the group consisting of polyimide, polyamide, acrylic resin, benzocyclobutene, and a phenol group by using a spin coating method, etc.

A predetermined opening through which a center portion of the pixel electrode 111 is exposed is formed in the PDL 109, and an organic light emitting layer that emits light is deposited in a region defined by the predetermined opening, and thus the emission region is defined. Meanwhile, when the emission region by the opening is formed in the PDL 109, a part protruding from the emission region is naturally generated between emission regions, and no organic light emitting layer is formed in the part, and thus the non-emission region is defined.

The opposite electrode 112 may be formed using Li, Ca, LiF/Ca, LiF/Al, Al, Mg, Ag, or the like having a low work function. The opposite electrode 112 may be formed over an entire surface of the substrate 100 as a common electrode. Also, the opposite electrode 112 may be connected to an external terminal (not shown) and thus may function as a cathode electrode. In other implementations, polarities of the pixel electrode 111 and the opposite electrode 112 may be switched.

The intermediate layer 113 includes an organic light-emitting layer that is formed of a small molecule organic material or a polymer organic material. When the organic light-emitting layer is a small molecule organic layer formed of a small molecule organic material, a hole transport layer (HTL) and a hole injection layer (HIL) may be stacked below the organic light-emitting layer toward the pixel electrode 111, and an electron transport layer (ETL) and an electron injection layer (EIL) may be stacked on the organic light-emitting layer toward the opposite electrode 112. In addition to these layers, various layers including an HIL, an HTL, an ETL, an EIL or the like may be stacked on or below the organic light-emitting layer according to necessity.

Meanwhile, when the organic light-emitting layer is a polymer organic layer formed of a polymer organic material, only a polymer HTL may be stacked on the organic light-emitting layer toward the pixel electrode 111. The polymer HTL is formed of poly(3,4-ethylenedioxythiophene) (PEDOT) or polyaniline (PANI) and formed on the pixel electrode 111 by using an inkjet printing method or a spin coating method.

The display portion 110 used in the present specification includes the TFT array formed on the substrate 100 and the OLED. Thus, the display portion 110 includes a plurality of emission regions in which the OLED is disposed and a non-emission region that is the PDL 109 protruding from the plurality of emission regions.

The sealing material 410 is disposed on the substrate 100 to surround the display portion 110. The encapsulation substrate 200 is disposed on the display portion 110 to encapsulate the display portion 110 through the sealing material 400. The sealing material 410 and the encapsulation substrate 200 may protect the display portion 110 from external moisture or air.

Similar to the substrate 100, the encapsulation substrate 200 be formed of various materials such as a plastic material, such as acryl, a glass material, or a metal material, such as a metal plate.

The sealing material 410 may include a sealing glass frit. Although the encapsulation substrate 200 and the sealing material 410 are shown in the embodiments, in other implementations, a thin encapsulation film may be formed on the display portion 110 instead of the encapsulation substrate 200 and the sealing material 410, thereby protecting the display portion 110. In this case, the thin encapsulation film may have a structure in which a layer including an inorganic material, such as silicon oxide or silicon nitride, and a layer including an organic material, such as epoxy or polyimide, are alternately stacked.

The moisture absorbent 420 is disposed in one side of the sealing material 410 facing the display portion 110. The moisture absorbent 420 may be used to easily react with moisture and air and prevent or avoid a reduction in the lifespan of the OLED due to moisture and air. The moisture absorbent 420 may be formed of one of an alkali metal oxide, an alkaline earth oxide, a metal halide, lithium sulfate, a metal sulfate, a metal perchlorate, silica gel, phosphorus pentoxide and a mixture of these. Other types and arrangements of the moisture absorbent 420 may be used.

Meanwhile, the filling material 300 is disposed on one surface of the encapsulation substrate 200. In more detail, the filling material 300 is disposed on a surface of the encapsulation material 200 facing the display portion 110 and is located within the sealing material 410 and the moisture absorbent 420.

Referring to FIG. 2, the filling material 300 contacts the non-emission region of the display portion 110 and does not contact the OLED disposed in the emission regions but is spaced apart from the OLED.

In the conventional organic light emitting display apparatus, since a partial region in the sealed boundary of the encapsulation substrate 200 contacts a sealant, an external shock may be focused on the sealant, which causes a problem in that peeling or a defective cell may occur. However, according to an embodiment, the filling material 300 is disposed to contact the non-emission region, thereby distributing the external shock and enhancing intensity. Further, the filling material 300 is spaced apart from the OLED, and thus the external shock may not be directly applied to the OLED. Furthermore, heat generated when the display portion 110 is driven may be easily dissipated to the outside owing to the filling material 300 contacting the non-emission region, thereby improving a heat dissipation characteristic according to an embodiment.

The filling material 300 of the organic light emitting display apparatus according to an embodiment is formed of cured polyimide. Although the polyimide may be transparent, in other implementations, the polyimide may be opaque. Even if the polyimide is an opaque material, the filling material 300 may be in a form of a thin film having a thickness of several tens or several hundreds of micrometers, and thus the filling material 300 may nevertheless be transmissive.

As described above, since an adhesion force between the opposite electrode 112 and the intermediate layer 113 of the conventional organic light emitting display apparatus is not good, in a case where the encapsulation substrate 200 is disposed directly on the display portion 110, stress may be applied to the opposite electrode 112 due to the encapsulation substrate 200, and the opposite electrode 112 having poor adhesion with the intermediate layer 113 disposed therebelow may be pulled out or rolled back, which may cause a failure to occur. If an epoxy based material and an acrylic based material were to be used as a filling material in order to prevent such a failure, a great amount of outgas could be generated, which could deteriorate the lifespan of the OLED.

However, according to an embodiment, the filling material 300 may be formed of a polyimide having good rub resistance, thereby preventing or reducing the likelihood of the opposite electrode 112 being pulled out. Further, the filling material 300 may be formed of a polyimide that generates less outgas than an epoxy based material and an acrylic based material, thereby preventing or reducing the lifespan deterioration of the OLED. A polyimide having a heat resistant temperature of about 400° C. may have excellent heat resistance, compared to an epoxy based material having the heat resistant temperature of about 200° C. or a silicon based material having a heat resistant temperature of about 310° C. The polyimide may resist burning or may not generate gas in a case where a peripheral temperature increases due to a short-circuit between devices of the display portion 110. Furthermore, a polyimide may have a limited property change with respect to a temperature change and thus a property thereof may not change and the outgas may not be generated with respect to the temperature change that occurs during transportation of a product after the product is manufactured or heat that is generated when the display portion 110 is driven, thereby increasing the driving lifespan of the display portion 1110 and reducing an occurrence of a failure of the product. In comparison, an epoxy based material may turn yellow and may generate outgas due to the heat generated when the display portion 110 is driven, which may reduce the lifespan of the product.

A method of manufacturing the organic light emitting display apparatus of FIG. 1 will now be described with reference to FIGS. 3 through 6.

Figure 3:
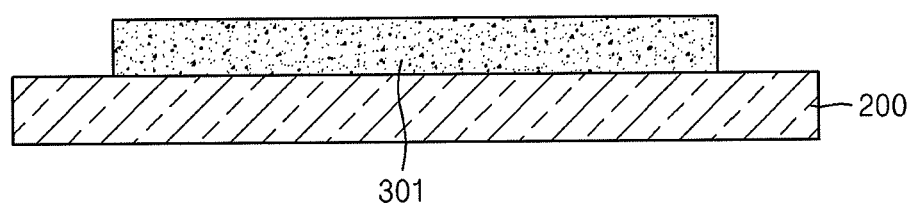
FIGS. 3 through 6 are schematic cross-sectional views depicting stages of a method of manufacturing the organic light emitting display apparatus of FIG. 1.

Referring to FIG. 3, polyimide 301 in a liquid state is coated onto one surface of the encapsulation substrate 200. In this regard, the term "polyimide 301 in the liquid state" refers to a fluidic state of polyimide melted in an organic solvent serving as a diluent. The polyimide 301 in a liquid state may be coated through a spin coating process, a slit coating process, or a gravure process. The polyimide 301 in the liquid state may be in a fluidic state having excellent planarization after being coated, thereby reducing a failure due to a step difference.

Figure 4:
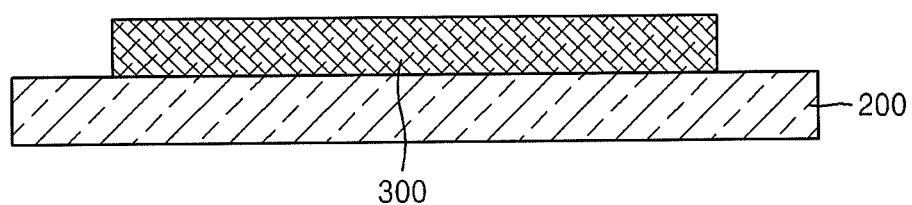

Referring to FIG. 4, the filling material 300 in a solid state is formed by hardening the polyimide 301 in the liquid state. The polyimide 301 in the liquid state is changed to the solid state by evaporating the organic solvent at high temperature. A hardening temperature may be about 200° C. to about 300° C. In addition to a thermal hardening method, in a case where the polyimide 301 in the liquid state includes a photosensitive material, a photo-hardening method may be applied, and a mixture of the thermal hardening method and the photo-hardening method may be applied.

In the conventional organic light emitting display apparatus, an epoxy based material or a silicon based material that is not hardened is used as the filling material 300 by contacting the epoxy based material or the silicon based material with the display portion 110. However, as described above, the epoxy based material or the silicon based material may turn yellow and may generates outgas due to heat generated when the display portion 110 is driven. However, according to an embodiment, a polyimide having excellent stability with respect to heat and generating a small amount of outgas is filled in a hardening state.

Figure 5:
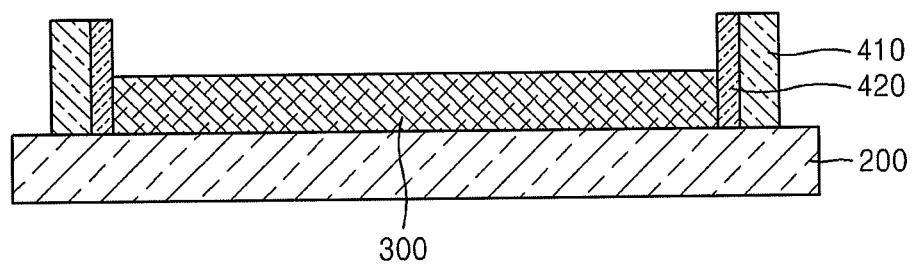

Referring to FIG. 5, the moisture absorbent 420 and the sealing material 410 are formed to surround the filling material 300. In this regard, the moisture absorbent 420 in a liquid state may be coated on one side of the sealing material 410 facing the display portion 110, and the sealing material 410 in the liquid state or in a paste form may be formed on encapsulation substrate 200.

Figure 6:
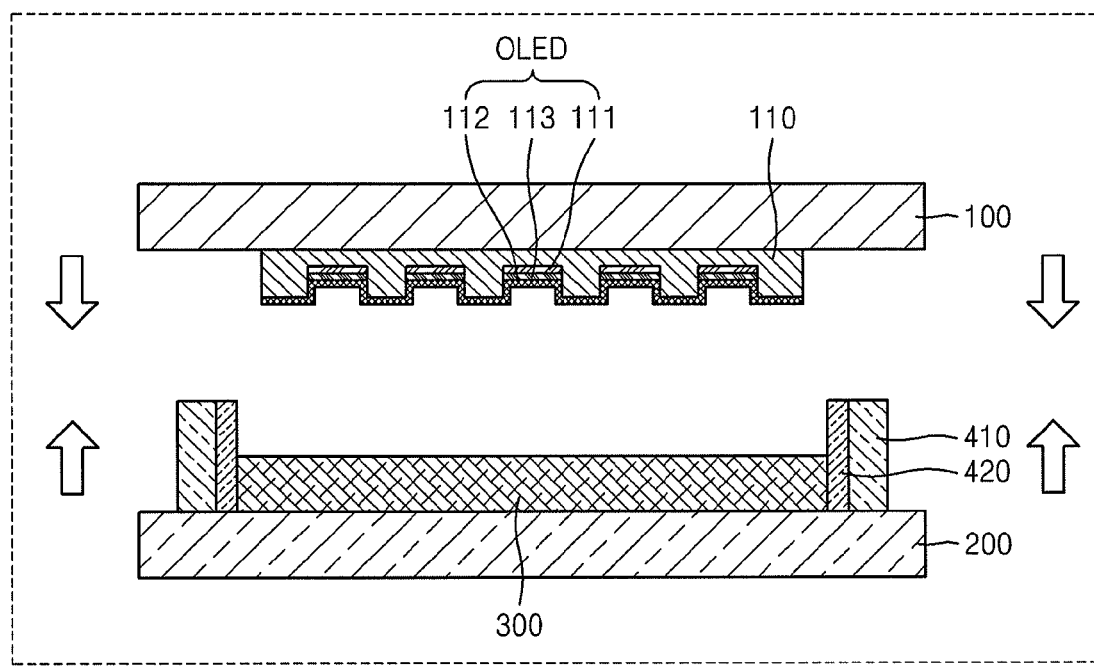

Referring to FIG. 6, the substrate 100, on which the display portion 110 including a TFT array and an OLED is formed, and the encapsulation substrate 200 are adhered to each other. In this regard, the substrate 100 and the encapsulation substrate 200 are disposed in such a way that the display portion 110 and the filling material 300 face each other and are adhered to each other in a vacuum state. In a case where the substrate 100 and the encapsulation substrate 200 are adhered to each other in the vacuum state, penetration of external moisture and impurities may be reduced. The substrate 100 and the encapsulation substrate 200 are adhered to each other using the sealing material 410 by irradiating ultraviolet rays onto the substrate 100 corresponding to the sealing material 410 and melting a surface of the sealing material 410 contacting the substrate 100. However, this is an exemplary method and a variety of methods may be used to bond the substrate 100 and the encapsulation substrate 200 according to a type of the sealing material 410.

Figure 7:
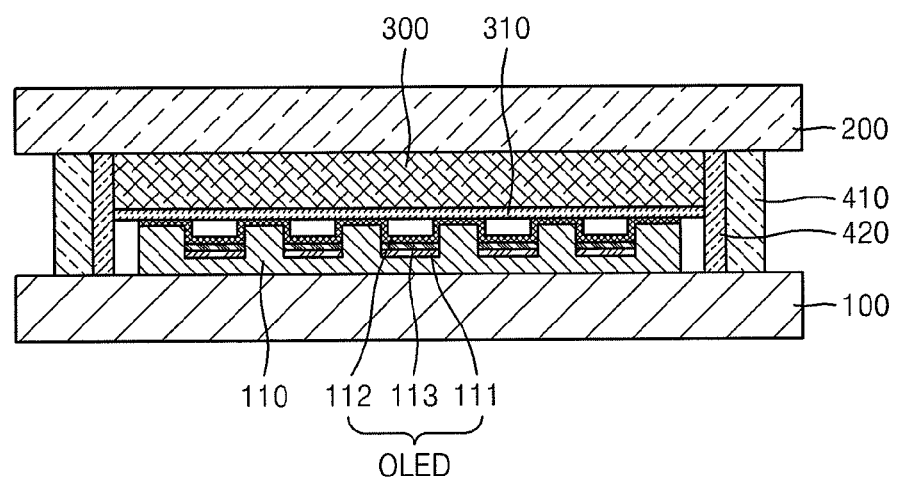
FIG. 7 is a schematic cross-sectional view of an organic light emitting display apparatus according to another embodiment.

FIG. 7 is a schematic cross-sectional view of an organic light emitting display apparatus according to another embodiment.

Referring to FIG. 7, the organic light emitting display apparatus according to this embodiment is different from the organic light emitting display apparatus of the previous embodiment in that a conductive layer 310 is further formed in one surface of the filling material 300 facing the display portion 110. The same elements are denoted by the same reference numerals between FIGS. 1 and 7, and a explanation thereof will not be repeated since the same elements have the same functions or operations.

The conductive layer 310 is formed of metal having a low conductive resistance. For example, the conductive layer 310 may include one or more materials selected from the group of aluminum (Al), platinum (Pt), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (Wu), and copper (Cu).

In a top emission type organic light emitting display apparatus, since light is emitted in a direction of the encapsulation substrate 200, the opposite electrode 112 is formed of transparent metal oxide. Such a transparent metal oxide may have high non-resistance. In a case where the opposite electrode 112 is formed over the entire surface of the substrate 100 as a common electrode, the opposite electrode 112 may generate a voltage difference according to a location thereof, which may cause a non-uniform image quality. In more detail, a voltage difference between a location closer to a terminal that applies power from the outside and a location farther from the terminal may occur due to a voltage drop, which may result in a brightness difference between pixels. Also, even in a case where the opposite electrode 112 of a bottom emission type organic light emitting display apparatus is formed of the metal having low resistance, the substrate 100 of an organic light emitting display apparatus may be wide. For example, the display apparatus may have width of about 40 inches or more. Accordingly, a voltage drop due to a location difference in the opposite electrode 112 may occur problematically.

According to the present embodiment, the conductive layer 310 is formed on one surface of the filling material 300 and electrically contacts the opposite electrode 112 formed in a non-emission region of the display portion 110 so that the conductive layer 310 may serve as an auxiliary electrode, thereby preventing or reducing the voltage drop and reducing resistance of the opposite electrode 112. Although not shown, the conductive layer 310 may be connected to an external terminal and thus an auxiliary voltage may be applied thereto. Further, the conductive layer 310 may further reduce a thickness of the opposite electrode 112 on the display portion 110.

Figure 8:
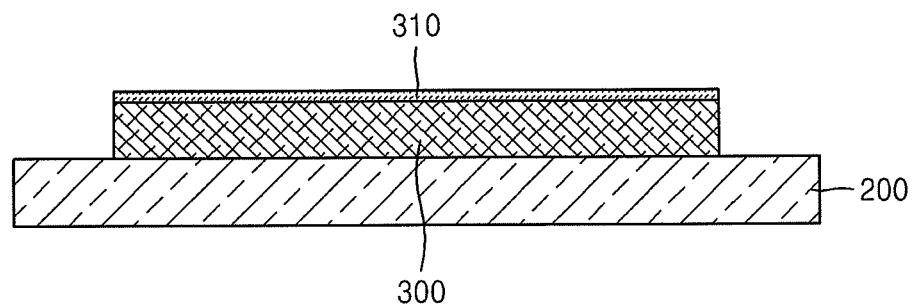
FIG. 8 is a schematic cross-sectional view for describing a method of manufacturing the organic light emitting display apparatus of FIG. 7.

FIG. 8 is a schematic cross-sectional view for describing an operation of a method of manufacturing the organic light emitting display apparatus of FIG. 7. The operation of FIG. 8 is further performed after the operations of FIGS. 3 and 4. The organic light emitting display apparatus may be manufactured as shown in FIG. 8 by performing the operations of FIGS. 5 and 6.

Referring to FIG. 8, the conductive layer 310 is further formed on the filling material 300 formed of the cured polyimide of FIG. 4. The conductive layer 310 may be formed by depositing the above-described thin metallic material having the low resistance.

Figure 9:
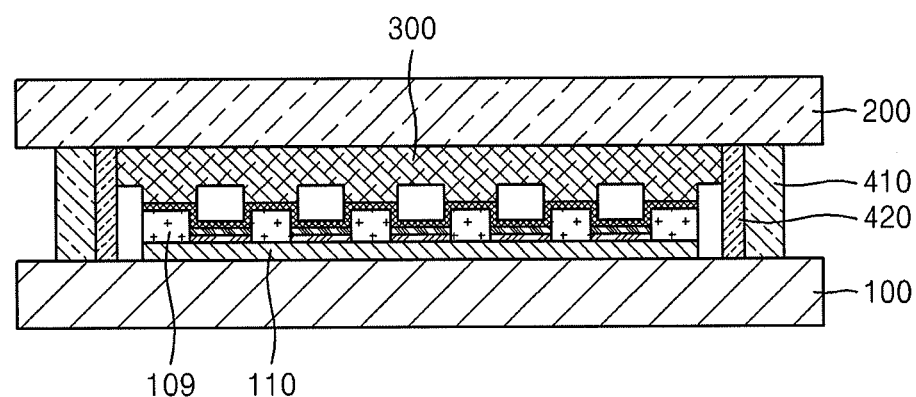
FIG. 9 is a schematic cross-sectional view of an organic light emitting display apparatus according to another embodiment.

FIG. 9 is a schematic cross-sectional view of an organic light emitting display apparatus according to another embodiment.

Referring to FIG. 9, the organic light emitting display apparatus according to this embodiment is different from the organic light emitting display apparatus of the previous embodiment in that the filling material 300 is patterned in such a way that a part corresponding to a non-emission region further protrudes compared to a part corresponding to an emission region. The same elements are denoted by the same reference numerals between FIGS. 1 and 9, and an explanation thereof will not be repeated since the same elements have the same functions or operations.

The filling material 300 is patterned to have a convexo-concave shape. A convex portion of the filling material 300 contacts the non-emission region of the display portion 110 and a concave portion thereof is formed in the part corresponding to the emission region of the display portion 110 so that the filling material 300 is further spaced apart from an OLED. In a case where the filling material 300 is patterned to have the convexo-concave shape, a gap as much as a thickness of the PDL 109 and a depth of the concave portion occurs in the emission region. Thereby, damage to the OLED from by particles that are smaller than the gap may be reduced or prevented. The filling material 300 does not directly contact the OLED and is far away from the OLED, and thus the filling material 300 may be desensitized to a fine outgas that is naturally generated therein.

FIGS. 10 through 13 are schematic cross-sectional views for describing some operations of a method of manufacturing the organic light emitting display apparatus of FIG. 9. The operations of FIGS. 10 through 13 are further performed after the operations of FIG. 3. The organic light emitting display apparatus may be manufactured as shown in FIG. 9 by performing the operations of FIGS. 5 and 6.

Figure 10:
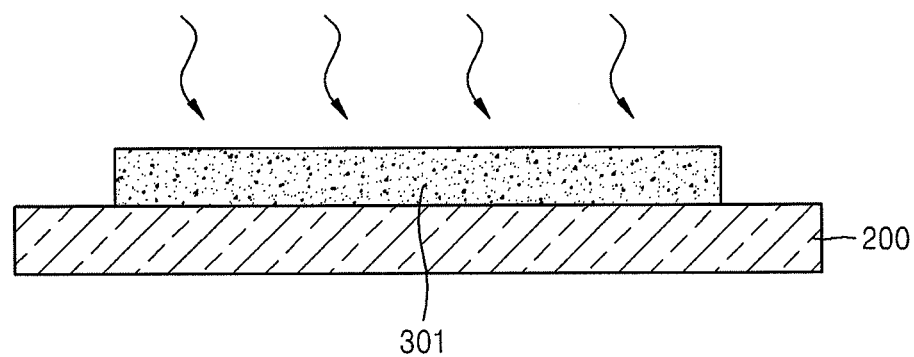
FIGS. 10 through 13 are schematic cross-sectional views depicting stages of a method of manufacturing the organic light emitting display apparatus of FIG. 9.

Referring to FIG. 10, the polyimide 301 in a liquid state of FIG. 3 is coated and soft-baked. The operation of FIG. 10 is an operation of removing a part of an organic solvent included in the polyimide 301 in the liquid state at low temperature and semi-curing or semi-drying the polyimide 301 in the liquid state to reduce fluidity.

Figure 11:
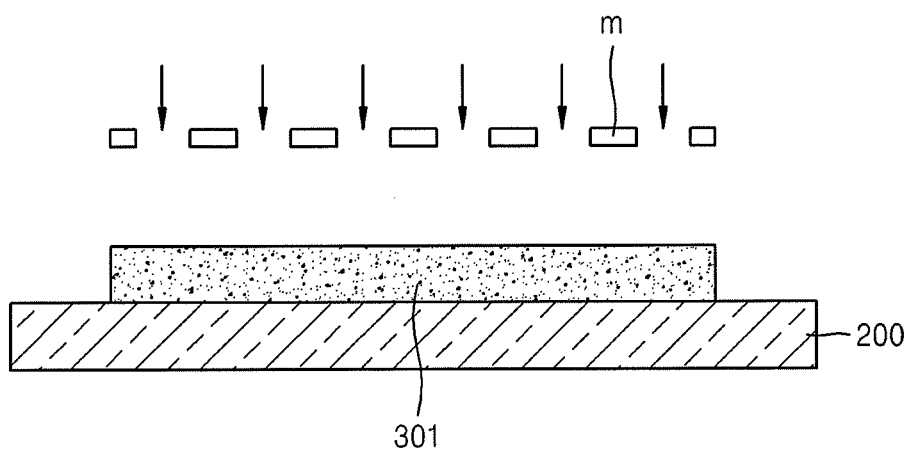
Figure 12:
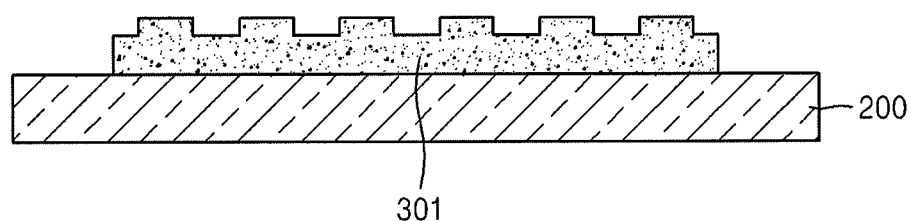

Next, referring to FIGS. 11 and 12, the polyimide of FIG. 10 is patterned using a mask. The mask having a desired shape is aligned, the polyimide is exposed, a polyimide coupling in a part to which light is irradiated is cut and developed, and patterned on the polyimide. In this regard, a process of patterning the polyimide is not limited thereto. The polyimide of the part to which light is irradiated remains and the polyimide of a part to which no light is irradiated may be removed. This is similar to a general photolithography process.

Figure 13:
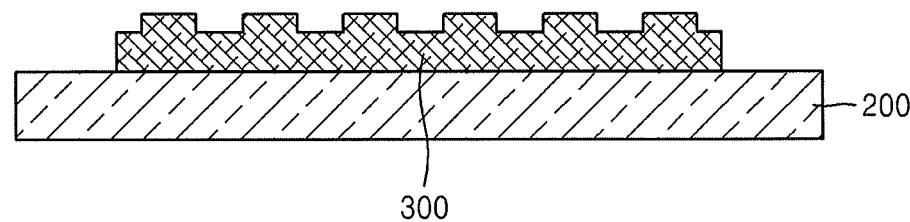

Referring to FIG. 13, the filling material 300 in a solid state is formed by curing the patterned polyimide. A process of curing the patterned polyimide is the same as described with reference to FIG. 4 and thus a description thereof is not repeated here.

Figure 14:
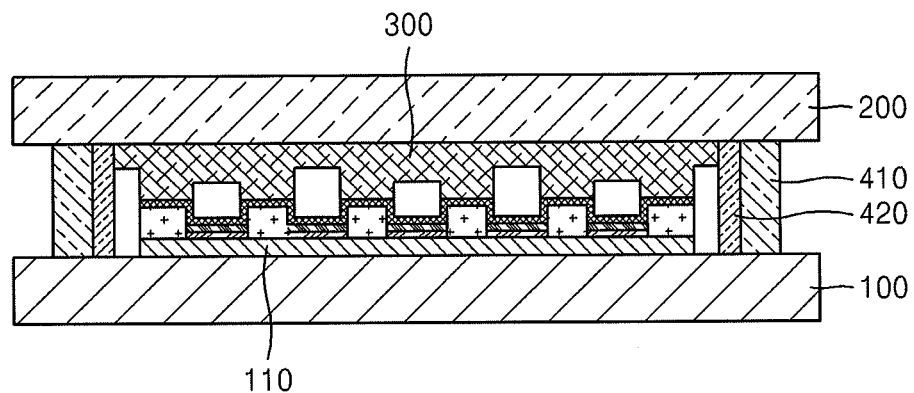
FIG. 14 is a schematic cross-sectional view of an organic light emitting display apparatus according to another embodiment.

FIG. 14 is a schematic cross-sectional view of an organic light emitting display apparatus according to another embodiment.

Referring to FIG. 14, the organic light emitting display apparatus according to this embodiment is different from the organic light emitting display apparatus described with reference to FIG. 9 in that the filling material 300 is patterned in such a way that a depth of a part of the filling material 300 corresponding to each of emission regions is not the same for each emission region. Herein, the term "depth" refers to a distance that the concave portion corresponding to an emission region extends in the filling material 300 in the direction of the substrate 200. The same elements are denoted by the same reference numerals between FIGS. 9 and 14, and an explanation thereof will not be repeated here since the same elements have the same functions or operations.

A convexo-concave shape of the filling material 300 may be implemented in various ways. As shown in FIG. 14, depths of concave portions of the filling material 300 may be differently formed for each of red (R), green (B), and blue (B) pixels. In this case, the same gap may be obtained for each type of pixel. In more detail, the same gap may be formed due to the concave portion for each pixel of the same color type of OLED, thereby applying the effects of preventing particles obtainable from the gap from causing damage and reducing an influence of an outgas for each color type of pixel in the same way. The concave portions of the filing material 300 having different depths of FIG. 14 may be obtained by performing an exposure process using a half-tone mask or a diffraction mask.

In other implementations, a height of a protrusion part of the filling material 300 corresponding to a non-emission region may be different for each pixel. In addition, a pattern shape of the filling material 300 may be modified according to various circumstances.

Figure 15:
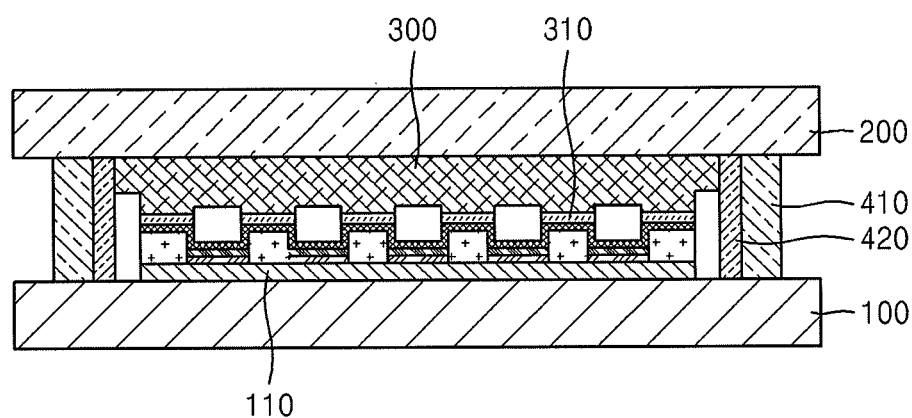
FIG. 15 is a schematic cross-sectional view of an organic light emitting display apparatus according to another embodiment.

FIG. 15 is a schematic cross-sectional view of an organic light emitting display apparatus according to another embodiment.

Referring to FIG. 15, the organic light emitting display apparatus according to this embodiment is different from the organic light emitting display apparatus described with reference to FIG. 9 in that the conductive layer 310 is formed on a part of the filling material 300 corresponding to a non-emission region. The same elements are denoted by the same reference numerals between FIGS. 9 and 15, and an explanation thereof will not be repeated here since the same elements have the same functions or operations.

The conductive layer 310 is formed only in a convex portion of the filling material 300 shown in FIG. 9 or 14 and thus electrically contacts the opposite electrode 112 of the display portion 110, thereby reducing resistance of the opposite electrode 112 and preventing a voltage drop thereof.

Figure 16:
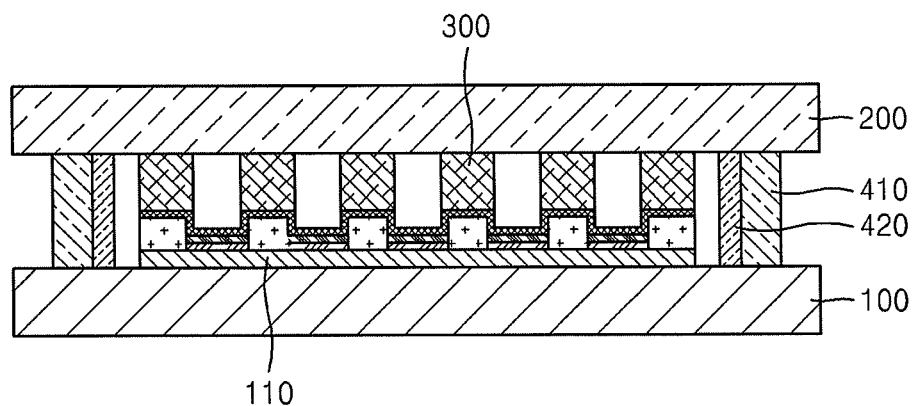
FIG. 16 is a schematic cross-sectional view of an organic light emitting display apparatus according to another embodiment.
Figure 17:
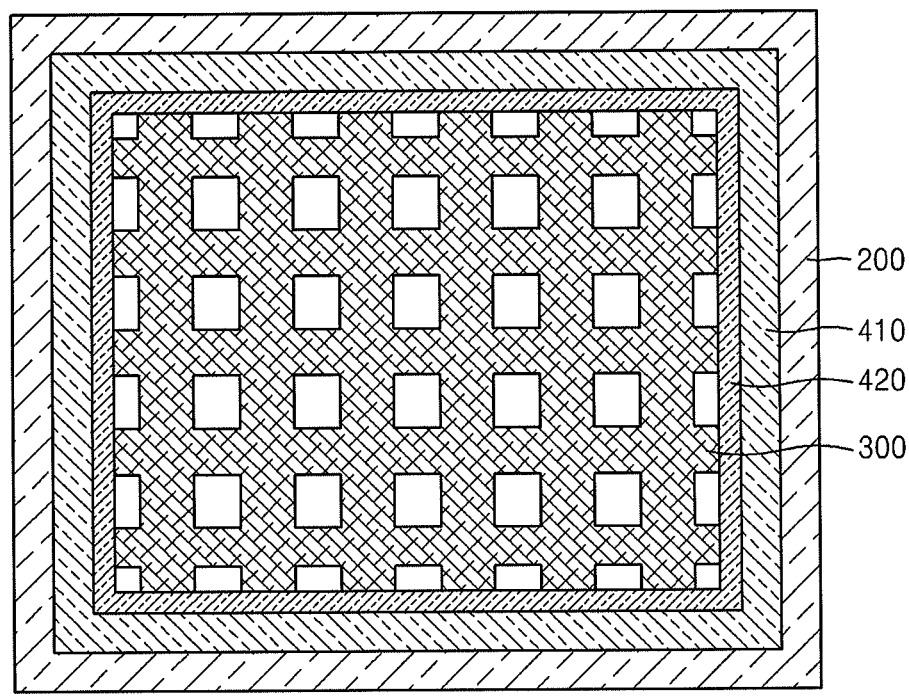
FIG. 17 is a schematic plan view of the organic light emitting display apparatus of FIG. 16.

FIG. 16 is a schematic cross-sectional view of an organic light emitting display apparatus according to another embodiment. FIG. 17 is a schematic plan view of the organic light emitting display apparatus of FIG. 16.

The organic light emitting display apparatus of FIG. 16 is different from the organic light emitting display apparatus described with reference to FIG. 9 in that the filling material 300 is patterned in such a way that a part of the filling material 300 corresponding to a non-emission region remains. The filling material 300 corresponding to the emission region may be removed. The same elements are denoted by the same reference numerals between FIGS. 9, 16, and 17, and an explanation thereof will not be repeated here since the same elements have the same functions or operations.

The filling material 300 is patterned in such a way that the part of the filling material 300 corresponding to the non-emission region remains. Referring to the plan view of FIG. 17, the filling material 300 may be patterned in the encapsulation substrate 200 in a mesh shape to surround emission regions.

Hence, a gap between an OLED and the encapsulation substrate 200 is generated in emission regions, thereby preventing the OLED from being damaged by particles smaller than the gap. Thus, if particles larger than the gaps shown in FIG. 9 were to penetrate into the organic light emitting display apparatus, a risk of damaging the OLED may be removed, and an effect of the gap may be maximized.

Figure 18:
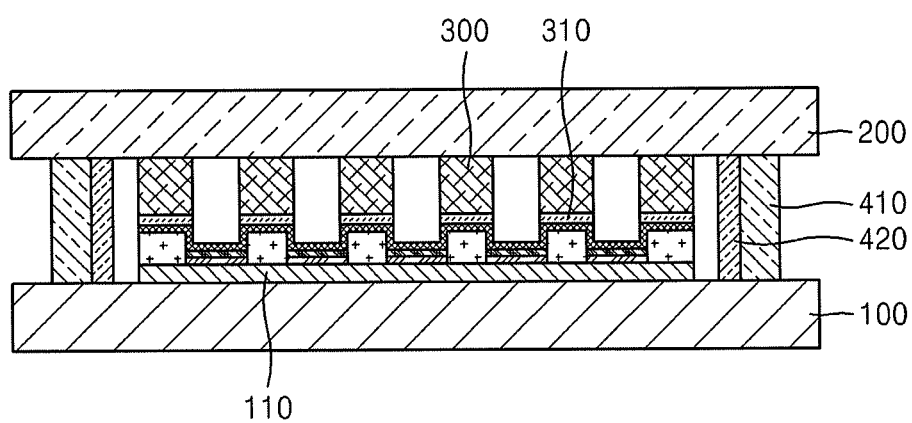
FIG. 18 is a schematic cross-sectional view of an organic light emitting display apparatus according to another embodiment.

FIG. 18 is a schematic cross-sectional view of an organic light emitting display apparatus according to another embodiment. The organic light emitting display apparatus of FIG. 18 is different from the organic light emitting display apparatus described with reference to FIG. 16 in that a conductive layer is further formed on the filling material 300 of the organic light emitting display apparatus of FIG. 16.

The OLED may be formed on a passivation layer, as shown in FIG. 7. In other implementations, the OLED may be formed on a gate insulation layer or an interlayer insulation layer by using a mask reduction method.

By way of summation and review, an organic light emitting display apparatus includes a display portion on a substrate and an encapsulation substrate to which a sealing member for sealing the display portion is adhered. An organic light emitting device including an emission layer disposed between an anode electrode and a cathode electrode is formed in the display portion. In this regard, the cathode electrode is formed on an entire surface of the substrate. When a cathode electrode formed of an inorganic material is formed on an emission layer formed of an organic material, adhesion of the cathode electrode may be reduced. Thus, if stress is applied to the cathode electrode that contacts the encapsulation substrate during a process of manufacturing the organic light emitting display apparatus or if stress is applied to the cathode electrode that contacts the encapsulation substrate due to bending of the organic light emitting display apparatus of a final product, a cathode electrode that does not have good adhesion with the emission layer therebelow may be pulled out or rolled back, which may cause a failure to occur.

In contrast, embodiments provide an organic light emitting display apparatus including a filling material to reduce the possibility of and/or to prevent a failure from occurring and a method of manufacturing the organic light emitting display apparatus. According to the one or more embodiments as described above, an organic light emitting display apparatus and a method of manufacturing the organic light emitting display apparatus uses a cured polyimide (PI) that has a good rub resistance as a filling material. The filling material does not directly contact an organic light emitting diode of the organic light emitting device. Thereby, damage to a cathode electrode may be reduced or prevented. The cured PI is used as the filling material, which may reduce an outgas compared to a case of using an epoxy based material and an acrylic based material. Thereby, the lifespan of the organic light emitting device may be increased. Meanwhile, heat generated by a display portion may be easily dissipated through the filling material, thereby improving a heat dissipation characteristic.

While the embodiments have been particularly shown and described with reference to exemplary embodiments thereof, it will be understood by those of ordinary skill in the art that various changes in form and details may be made therein without departing from the spirit and scope as defined by the following claims.

What is claimed is:

1. An organic light emitting display apparatus comprising:
    a substrate;
    a display portion on the substrate, the display portion including a plurality of emission regions, each including an organic light emitting diode (OLED), and a plurality of non-emission regions protruding from between the plurality of emission regions;
    an encapsulation substrate facing the substrate;
    a sealing material bonding the substrate and the encapsulation substrate, and sealing the display portion; and
    a filling material on a surface of the encapsulation substrate facing the display portion, the filling material being spaced apart from the OLED and including a cured polyimide (PI),
    wherein the filling material is patterned such that parts of the filling material corresponding to the non-emission regions protrude in a direction of the display portion compared to parts of the filling material corresponding to emission regions.

2. The organic light emitting display apparatus of claim 1, wherein the filling material contacts the non-emission regions.

3. The organic light emitting display apparatus of claim 1, further comprising a conductive layer on a surface of the filling material facing the display portion.

4. The organic light emitting display apparatus of claim 1, wherein depths of the parts of the filling material corresponding to the emission regions in a direction away from the display portion are not equal for each of the emission regions.

5. The organic light emitting display apparatus of claim 1, wherein the filling material is patterned such that only parts of the filling material corresponding to the non-emission regions are present.

6. The organic light emitting display apparatus of claim 5, wherein the filling material is patterned on the encapsulation substrate in a mesh type pattern.

7. The organic light emitting display apparatus of claim 1, wherein a conductive layer is present on the parts of the filling material corresponding to the non-emission regions.

8. The organic light emitting display apparatus of claim 7, wherein the OLED includes a first electrode on the substrate, an organic light emitting layer on the first electrode, and a second electrode on the organic light emitting layer,
   wherein the second electrode is present over an entire surface of the non-emission regions and the second electrode contacts the conductive layer in the non-emission regions.

9. The organic light emitting display apparatus of claim 1, further comprising a moisture absorbent disposed at one side of the sealing material facing the display portion.

10. A method of manufacturing an organic light emitting display apparatus, the method comprising:
    coating a polyimide (PI) in a liquid state on one surface of an encapsulation substrate;
    forming a filling material in a solid state by curing the polyimide (PI) in the liquid state;
    providing a display portion on one surface of a display substrate, the display portion including a plurality of emission regions, each including an organic light emitting diode (OLED), and a plurality of non-emission regions protruding from between the plurality of emission regions;
    placing the display substrate and the encapsulation substrate such that the display portion and the filling material face each other, and the filling material is spaced apart from the OLED; and
    bonding the display substrate and the encapsulation substrate using a sealing material, such that the sealing material seals the display portion,
    wherein the filling material is patterned such that parts of the filling material corresponding to the non-emission regions protrude in a direction of the display portion compared to parts of the filling material corresponding to emission regions.

11. The method of claim 10, wherein the bonding includes:
    coating the sealing material to surround edges of the filling material;
    placing the display substrate and the encapsulation substrate such that the display portion and the filling material face each other; and
    bonding the display substrate and the encapsulation substrate by using the sealing material in a vacuum state.

12. The method of claim 10, wherein the forming of the filling material includes:
    soft-baking the polyimide (PI) in the liquid state;
    patterning the softe-baked polyimide (PI) using a mask; and
    forming the filling material in the solid state by curing the patterned polyimide (PI).

13. The method of claim 10, further comprising, after the forming of the filling material, forming a conductive layer on the filling material.

14. The method of claim 10, wherein the polyimide (PI) in the liquid state includes an organic solvent.

15. The method of claim 10, further comprising: before the bonding, forming a moisture absorbent at one side of the sealing material facing the display portion.

16. The method of claim 12, further comprising, after the forming of the filling material, forming a conductive layer on the filling material.

\* \* \* \* \*